United States Patent [19]

Schmitz et al.

[11] Patent Number: 4,659,931
[45] Date of Patent: Apr. 21, 1987

[54] HIGH DENSITY MULTI-LAYERED INTEGRATED CIRCUIT PACKAGE

[75] Inventors: Charles E. Schmitz, Irvine; Richard C. Wimberly, Huntington Beach; Donald J. Carlson, Tustin, all of Calif.

[73] Assignee: Grumman Aerospace Corporation, Bethpage, N.Y.

[21] Appl. No.: 731,988

[22] Filed: May 8, 1985

[51] Int. Cl.⁴ .................. H01L 27/14; H05K 1/14
[52] U.S. Cl. .................. 250/338; 250/332; 250/370; 174/68.5; 361/414
[58] Field of Search .................. 361/414; 250/370 G, 250/338 SE, 349, 332; 174/68.5

[56] References Cited

U.S. PATENT DOCUMENTS

| | | | |
|---|---|---|---|
| 3,349,162 | 10/1967 | Eckhardt et al. | 174/68.5 |
| 3,349,481 | 10/1967 | Karp | 29/627 |
| 3,400,210 | 9/1968 | Reimer | 361/414 |
| 3,403,300 | 9/1968 | Horowitz et al. | 361/414 |
| 3,436,604 | 4/1969 | Hyltin et al. | 361/414 |
| 3,483,308 | 12/1969 | Wakely | 174/52 |
| 3,499,218 | 3/1970 | Dahlgren et al. | 361/414 |
| 3,601,522 | 8/1971 | Lynch | 174/68.5 |
| 3,634,600 | 1/1972 | Griffin et al. | 361/414 |
| 3,705,332 | 12/1972 | Parks | 361/414 |
| 3,760,090 | 8/1971 | Fowler | 361/414 |
| 3,777,221 | 12/1973 | Tatusko et al. | 361/414 |
| 3,852,714 | 12/1974 | Carson | 340/146.3 F |
| 3,875,479 | 4/1975 | Jaggar | 361/414 |
| 3,917,983 | 11/1975 | Kuronen | 361/414 |
| 3,926,746 | 12/1975 | Hargis | 361/414 |
| 3,970,990 | 7/1976 | Carson | 340/146.3 F |
| 4,249,302 | 2/1981 | Crepeau | 361/414 |
| 4,283,755 | 8/1981 | Tracy | 361/414 |
| 4,288,841 | 9/1981 | Gogal | 361/414 |
| 4,304,624 | 12/1981 | Carson et al. | 156/630 |
| 4,320,438 | 3/1982 | Ibrahin et al. | 361/401 |
| 4,352,715 | 10/1982 | Carson et al. | 156/634 |
| 4,354,107 | 10/1982 | Carson et al. | 250/239 |
| 4,371,744 | 2/1983 | Badet et al. | 174/68.5 |
| 4,423,468 | 12/1983 | Gatto et al. | 361/404 |

Primary Examiner—Carolyn E. Fields
Attorney, Agent, or Firm—Stetina & Brunda

[57] ABSTRACT

A method and apparatus are disclosed for forming a high density multi-layered detector array module. The module body is formed of multiple non-conductive, thin film layers supporting a plurality of electronic devices. The module utilizes conductive patterns formed on the surface of a plurality of the layers to effect connections between and among electronic devices and external electronics. A detector array and an electrical interconnect may be joined to end portions of the module, in electrical communication with the layer conductive patterns. Transverse conductive connectors such as vias are provided within the module extending between the layers. Connections between and among the electronic devices and external electronics are thereby supported by transverse connections within the module and the electrical interconnect. The interconnect may be formed as a back plane extending transverse to the plane of the layers or as a plurality of discrete conductive strips disposed on the surface of one or more of the layers.

17 Claims, 7 Drawing Figures

HIGH DENSITY MULTI-LAYERED INTEGRATED CIRCUIT PACKAGE

BACKGROUND OF THE INVENTION

The present invention was made in performance of Contract No. F04701-76-C-0191 with the United States government, which retains a royalty-free license to practice the invention for government purposes.

The present invention relates to multi-layered integrated circuit packages, and more particularly, to high density multilayered packages for providing on-focal plane processing of signals from an adjacent array of infrared detectors.

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photodetectors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, advances in semiconductor materials and highly sensitive electronic circuitry have advanced the performance of contemporary infrared detectors close to the ideal photon limit.

Current infrared detection systems incorporate arrays of large numbers of discrete, highly sensitive detector elements the outputs of which are connected to sophisticated processing circuitry. By rapidly analyzing the pattern and sequence of detector element excitation, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total of 65,536 detectors, the size of each square detector being approximately 0.0035 inches on a side with 0.0005 inches spacing between detectors. The total width of such a subarray would therefore be 1.024 inches on a side. Thus, interconnection of such a subarray to processing circuitry requires a connective module with sufficient circuitry to connect each of the 65,536 detectors to processing circuitry within a square a little more than one inch on a side. The subarrays may, in turn, be joined to form an array that includes 25 million detectors or more. Considerable difficulties are presented in aligning the detector elements with conductors on the connecting module and in isolating adjacent conductors in such a dense environment.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a detector connecting module that performs at least a portion of the signal processing functions within the module, i.e. on integrated circuit chips disposed adjacent the detector focal plane, the signal from each detector need be transmitted only a short distance before processing. As a consequence of such on-focal plane or "up front" signal processing, reductions in size, power and cost of the main processor may be achieved. Moreover, up front signal processing helps alleviate performance, reliability and economic problems associated with the construction of millions of closely spaced conductors connecting each detector element to the main signal processing network.

In order to exploit the advantages of on-focal plane processing of the input signals, it is desirable to provide a detector module that can provide necessary interconnections between module processors and between module processors and external electronics, with a minimum of wiring congestion and using a minimum of module space, thereby reserving additional module space for on-focal plane processing. The present invention provides a method and an apparatus to achieve such a result.

In the prior art, a number of detector array modules have been proposed for coupling an array of closely spaced detectors to processing circuitry. Such modules are typically formed such that all connections to and from the module are disposed on a first horizontal layer, with electronic devices and connecting circuitry disposed within the module on one of several stacked horizontal layers interconnected by vertical conductors, known as vias, extending through the layers. A principal shortcoming of those constructions is that a single layer is unduly congested with connections to all detectors and external electronics and must also support a large number of vias extending to the parallel layers. The number of detector elements that may be connected as well as the number of connectors to external electronics that supports on-focal plane processors are thereby limited by the size of the connecting layer and the minimum width and spacing of the conductors. Moreover, where the connecting layer becomes overly congested with conductors the electronic devices must be formed on a different layer, requiring conductive vias which further congest the module layers, adding weight and cost to the module and introducing potential performance problems.

Other modules proposed in the prior art address the congestion and space optimization problem by orienting the detector array perpendicular to the plane of the module layers, adjacent to one edge of the module. Such constructions, commonly referred to as "Z-technology architectures", are disclosed in U.S. Pat. No. 3,970,990 to Carson, assigned to the common assignee, and U.S. Pat. No. 4,304,624 to Carson, et al. Z-technology modules are typically formed by stacking multiple layers of thin film substrates and bump bonding an end of each layer to an adjacent row of the detector array. Conductors extending along the surface of the substrates have end portions that are carefully aligned to contact leads from the individual detector elements. Such constructions advantageously avoid wiring congestion associated with connecting all detectors to a single module layer and reduce the accompanying need for vertical vias that detract from the useable space within the module.

Though facilitating greater use of the module space in connecting the detector elements to the electronic devices housed in the module, the above-described contemporary systems fail to disclose a construction for making most efficient use of space needed to connect the internal electronic devices to each other, and to external electronics. Such a construction, as set forth hereinafter, advantageously utilizes surface area not used in contemporary modules, reduces wiring congestion and increases the space available for on-focal plane processing.

SUMMARY OF INVENTION

A method and apparatus are provided for forming a high density multi-layered integrated circuit module that provides greater utilization of the space in a three-dimensional module to support wiring and on-focal plane processing of signals from an infrared detector array. The multi-layered module includes a plurality of substantially overlapping thin film substrate layers and intermediate adhesive sheets disposed in close parallel relationship to form a non-conductive supporting body. The layers support electronic devices that may perform various signal processing functions. A detector array is connectable to the body on one end transverse to the orientation of the layers. Interconnected conductive patterns are provided on the surface of the layers that can connect the electronic devices to each other, to portions of the detector array and to external electronics. Conductive connectors such as wire bonds and conductive vias, are provided to facilitate interlayer connections, e.g. for interconnecting the devices to conductive patterns formed on a plurality of layers. An electrical interconnect, formed along a portion of the body, is connectable to external electronics and to the conductive patterns along edge portions of at least several of the layers. The interconnect facilitates interdevice connections and communicates output and control signals, e.g. clock and bias, between the module, and external electronics. The interconnect may be formed as a back plane disposed transverse to the plane of the layers in abutting electrical connection with the conductive patterns. Alternatively, the interconnect may be formed as a plurality of discrete conductive strips disposed on the surface of at least one of the layers.

DETAILED DESCRIPTION OF THE PREFERRED EMBODIMENT

Figure 1:
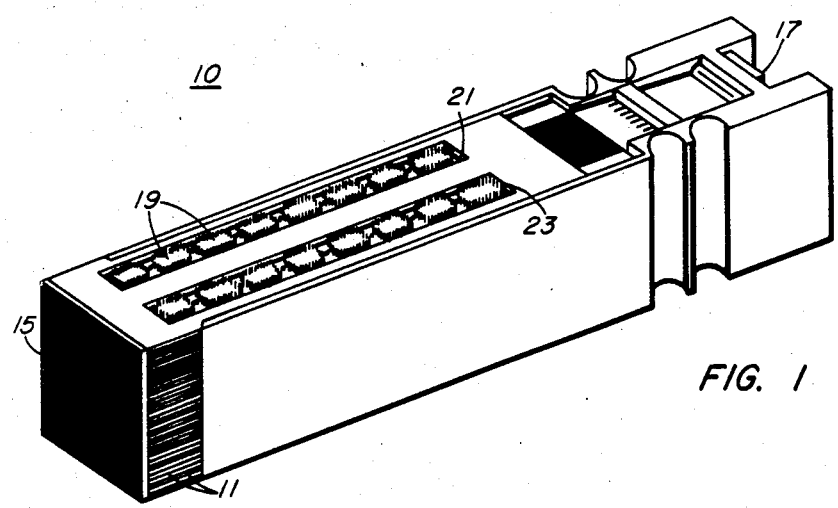
FIG. 1 is a perspective view of an exemplary sub-array assembly including a plurality of multi-layer detector array connecting modules formed in accordance with the present invention.

Referring now to FIG. 1 wherein there is shown a detector subarray including a plurality of modules 11 that may be formed in accordance with the present invention. Sub-array 10 is connected on one end to a detector array portion 15 and on an opposite end to a connector 17 adapted to interface the subarray to external electronics (not shown). Information relating to various aspects of the construction of modular infrared detection systems is disclosed in U.S. Pat. Nos. 4,304,624; 4,352,715; and 4,354,107 to Carson, et al. It is to be understood, however, that the present invention is not intended to be limited to use in connection with a particular shape of module or design of detector array. The unique technique described herein for interconnecting the electronic devices mounted within module 11 and connecting those devices to external electronics is believed to have application well beyond the particular embodiment described and illustrated herein.

Figure 2:
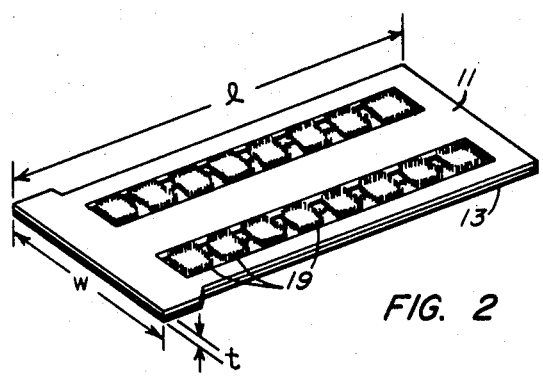
FIG. 2 is a perspective view of a single module of the subassembly illustrated at FIG. 1.
Figure 3:
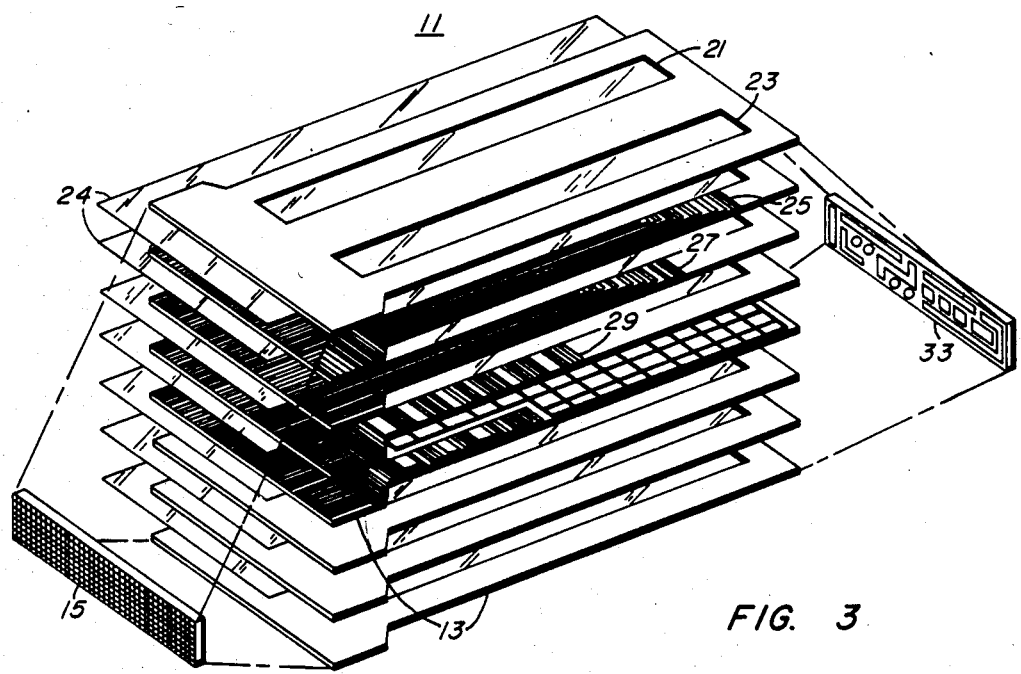
FIG. 3 is an exploded view of a portion of the module of FIG. 2 illustrating the interface between the individual modules, the detector array portion and the module back plane.

Individual modules 11, shown generally at FIG. 2, are multiple layer structures, as shown in more detail at FIG. 3. Each module 11 is a stacked laminated structure that provides separate attachment interfaces for detector elements and external electronics. The surface of the stacked layers 13 provides area for on-focal plane signal processing by integrated circuits or other active or passive electronic devices 19. Devices 19 may be active or passive electronic components. In the presently preferred embodiment devices 19 comprise identical integrated circuits.

Figure 5:
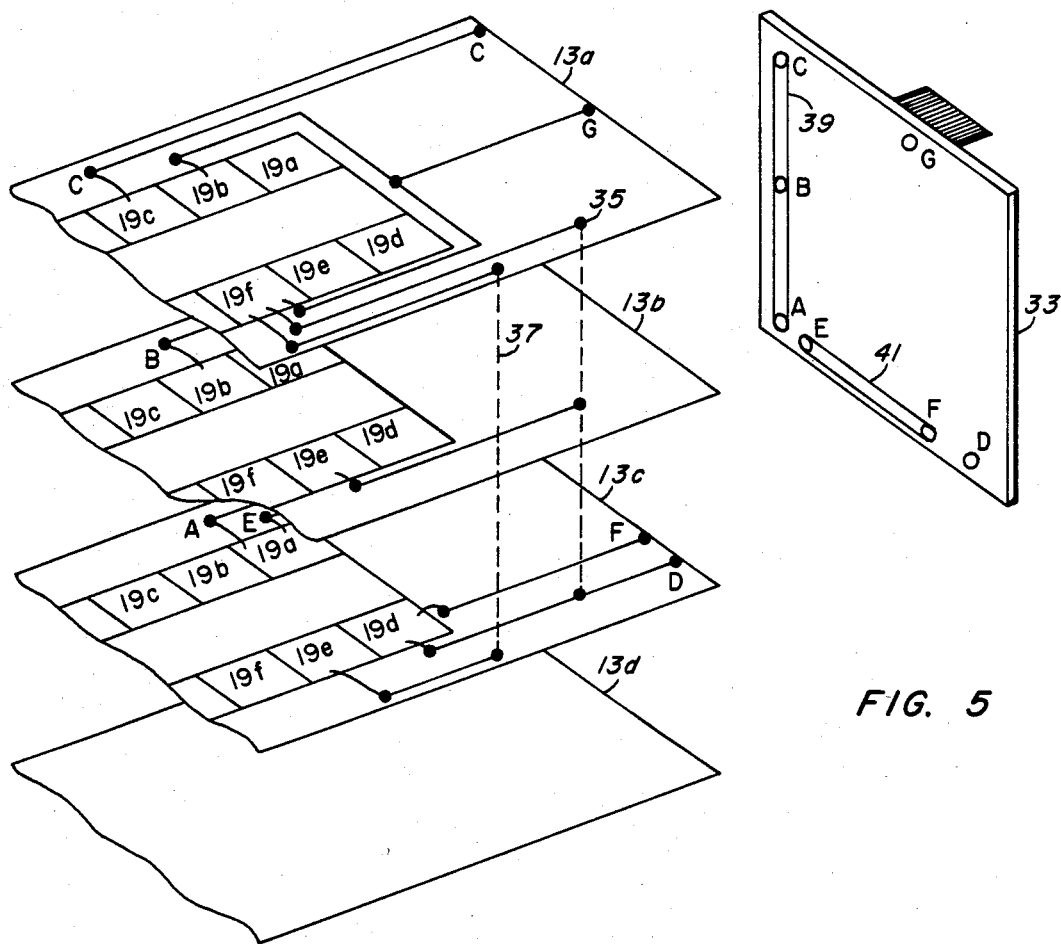
FIG. 5 is an exploded view of a portion of the module of FIG. 1 illustrating exemplary connections between module layers and the module back plane.
Figure 6:
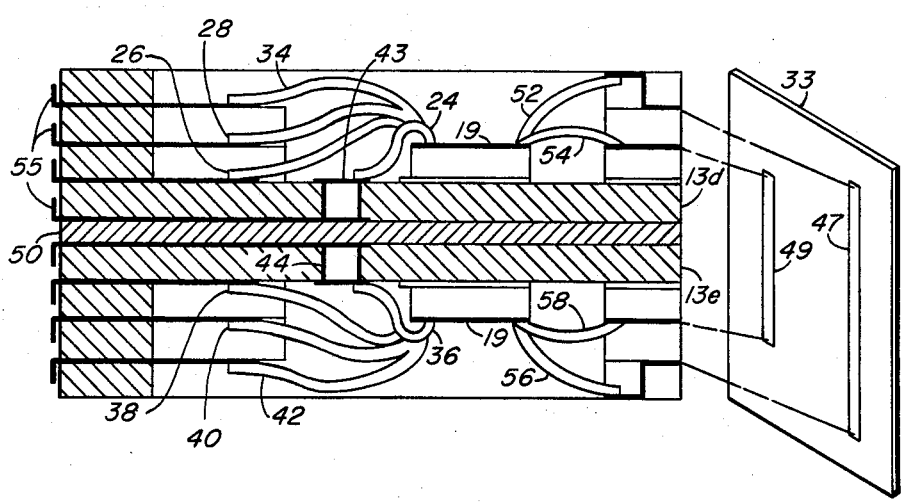
FIG. 6 is an elevational view of a cross-section of an exemplary module illustrating connections to and between electronic devices mounted on different substrate layers.

Each layer 13 within module 11 is formed as a thin film of a non-conductive material, such as alumina, with adhesive sheets 24 interposed between layers. Each layer preferably has a delineated metal circuit pattern on a major surface thereof which serves to facilitate necessary connections between electronic devices, detector elements and external electronics. The conductive metal patterns may be disposed on one or both sides of the layers. Each layer 13 of module 11 typically supports a pattern of metalized conductors, a first portion of which is adapted to connect a dedicated row of detector elements in abutting array portion 15 to electronic devices 19 mounted on the same or a different layer, and a second portion of which connects electronic devices to other electronic devices and to an interconnect in communication with external electronics. Exemplary conductive patterns formed on the surface of layer 13 for interconnecting the individual detectors to electronic devices 19 are illustrated at FIGS. 5 and 6 of the above-referenced Carson patents. It should be noted, however, that various other conductive patterns connecting the detector elements to the electronic devices may be implemented within the scope of the present invention.

Typically, a row of detectors abutting each layer 13 serves as inputs to one or more dedicated electronic devices 19 within the module 11. The thickness of the layers is typically determined in view of the center line spacing between adjacent detector elements and the structural characteristics of the material used to form the layer. The size and construction of modules 11 may be determined after the physical constraints and performance requirements of the particular application have been evaluated.

Depending upon the thickness of the electronic devices 19, cavities such as cavities 21 and 23 may be formed in one or more of the layers 13 with the devices 19 mounted on layers offset from the layer supporting the respective input circuitry. It should be noted that devices 19 need not all be mounted on the same layer, and may be mounted at stepped levels within the module or on opposite sides of the center of the module, as shown at FIG. 6. Moreover, where the devices are formed to be approximately the thickness of layers 13 the devices may be mounted within openings in the layers, thereby eliminating the need for cavities in adjacent layers.

In accordance with the embodiment set forth at FIG. 3, the module layers support conductive patterns, a portion of which facilitates connections between a row of detector elements and a pair of dedicated devices 19 disposed one each within channels 21 and 23, equidistant from the detector elements. In practice, each device 19 may include 64 channels or more, each channel being identical and dedicated to an individual detector element on the associated row of the array portion 15. The conductive patterns to support connections between the detector elements and electronic devices are partially illustrated at FIG. 3 wherein it is shown that conductive patterns 25, 27 and 29 extend to different positions along the length of modules 13.

In contemporary modules, the area of each layer 13, to the right of conductive portions 25, 27 and 29, is largely unused. In accordance with prior techniques, interconnections among devices 19, and between devices 19 and external electronics are typically implemented on a bottom layer that supports the devices 19. Moreover, the arrangement of the output connections from all devices 19 to external electronics had been formed along the surface of a single layer, i.e. the same layer supporting devices 19, and therefore results in undue congestion on that layer and consequently introduces potential performance problems. In contrast to such prior techniques the present invention permits the electronic devices to be formed on a plurality of layers connected to each other and to external electronics by conductive patterns formed on a plurality of the module layers with conductors extending transverse to the plane of the layers. The transverse conductors may be implemented in conjunction with a transverse back plane 33 adapted to interconnect the electronic devices and external electronics. The invention permits greater utilization of the module space to support connections between the devices and external electronics, and thereby increases the module space practically available to support on focal plane processing on one or more of the layers.

Figure 4:
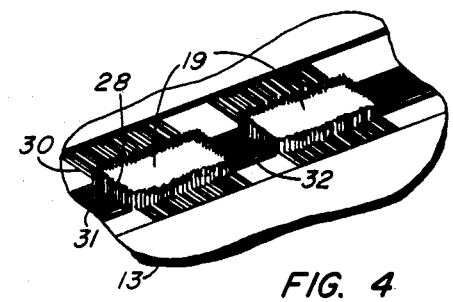
FIG. 4 is an enlarged perspective view of a pair of electronic devices mounted on a module layer, showing exemplary connections thereto.

FIG. 4 illustrates one manner of connecting devices 19 to conductive patterns formed on a single supporting layer 13. Connections to and from the devices are effected using wire bonds 28 bridging the devices and conductors 30, 31 and 32 on layer 13. Though it may be practical in some applications to form all connections between devices 19 and external electronics on a single layer, e.g. where only a small number of devices are arranged in a single row, variations in the arrangement of the devices as well as increases in the number and sophistication of devices 19 will require additional surface area to support the wiring.

FIGS. 5 and 6 illustrate alternative embodiments of the present invention which illustrate constructions for effecting connections among devices 19, and between devices 19 and external electronics. In accordance with the illustrated embodiments the devices and the conductive patterns may be distributed among the substrate layers to permit the most efficient use of the module space. The illustrated embodiments utilize conductive patterns formed on a plurality of layers in conjunction with the use of transverse conductive connectors and/or a complementary conductive pattern formed on a back plane 33 disposed transverse to the plane of the layers.

The present invention facilitates inter-device connections along a single layer, or between layers. Conductive connections between layers may be implemented by means of wire bonds, vias 35, 37, or by means of metalized regions 39 and 41 disposed on back plane 33. At least some of the metallized regions are in turn connected to conductors 49 that lead to the external electronics. The invention thus permits interconnections to be made within the module body transverse to the plane of the layers, along the surface of the layers, or along the back plane. The precise combination of conductive patterns on and interconnecting each layer 13, is a matter of design choice in view of processing requirements, conductor density, detector element spacing, layer thickness, and interconnection requirements in a particular application.

FIG. 5 illustrates simplified conductive patterns intended to represent only a few of the types of connections that may be implemented within the scope of the present invention. As shown at FIG. 5 connections to and from devices 19 may be made along a single layer, such as shown on the surface of layer 13a interconnecting devices 19b and 19f. Alternatively, each device 19 may be mounted on or connected to a different layer, and interconnected by means of a via, such as via 37 connecting device 19f and device 19e mounted on layers 13a and 13c, respectively.

Common connections to numerous devices, e.g. to provide bias, may be effected by connecting a back plane conductive region to a conductive via 35, connecting devices such as devices 19d, 19e and 19f on layers 13c, 13b and 13a, respectively. Alternatively, such connections may be facilitated by a conductive region 39 disposed on back plane 33 (enlarged for illustrative purposes), connecting devices, such as 19a, 19b and 19c on layers 13c, 13b and 13a, respectively. Such an alternative may be desirable, for example, where it is unnecessary to connect intermediate layers and, therefore, the space on the intermediate layers may be more advantageously devoted to supporting additional electronic devices.

In a still further variation, connective region 41, on back plane 33, may be used to connect devices such as 19a and 19d even though each device is connected to a common layer, such as 13c. That variation may be preferable, for example, where the surface area intermediate devices 19a and 19d is occupied with other conductors. Other three-dimensional conductive connecting patterns may be designed to make the best use of available space in view of the connection requirements and may be implemented within the scope of the present invention.

In a further embodiment, illustrated at FIG. 6, module 13 may be formed to include a plurality of electronic device supporting layers in back-to-back relation with connections to detector elements or between devices 19 affected by means of conductive vias such as vias 43 and 44 extending through module center layers 13d and 13e, or by means of common connection to conductive regions 49 and 47 formed on back plane 33.

As shown at FIG. 6 detector element interconnectors 51 are formed along an edge portion of the module. The connectors 51 are connectable to corresponding detector elements within detector array 15 (shown at FIG. 3). Interconnections between devices 19 and a first portion of the conductive patterns leading to the detector elements are effected by wire bonds 24, 26, 28, 34, 36, 38, 40 and 42. Insulating layer 50 separates layers 13d and 13e, thereby permitting conductive patterns to be formed on the opposing surfaces of those layers. Interconnections between devices 19, and between those devices and external electronics, are effected by wire bonds 52, 54, 56 and 58 connecting the devices to portions of the conductive pattern which are in turn connected to conductive regions 47 and 49 on the back-plane 33. Interconnections may be effected using conductive patterns formed on any layer.

Figure 7:
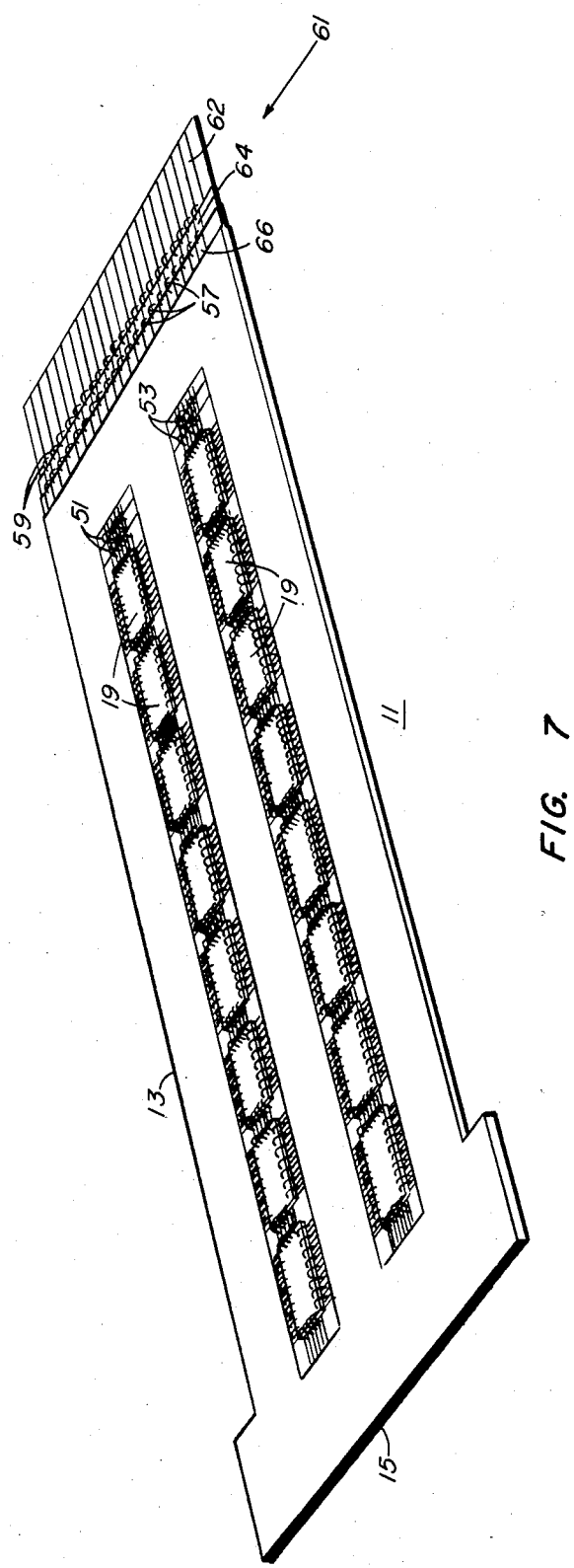
FIG. 7 is a perspective view of a module construction incorporating an alternate electronic interconnect.

FIG. 7 illustrates another embodiment of the invention wherein two rows of devices 19 are provided on one side of the module, with one or two similar rows provided on the opposite side of the center layer. Each row is serviced by a separate but identical bus (not shown) provided under the device supporting layers. Each bus communicates signals between a plurality of devices 19 and the interconnect 61 to external electronics. In order to connect each bus to external electronics the bus lines are connected to conductive patterns on different layers by wire bonds 55 and 53. The conductive patterns on those layers are arranged such that the conductors to each bus are brought to substantially overlapping registry in the same signal sequence. The conductors may then be connected to each other, and to external interconnect 61 by means such as wire bonds 57 and 59. In the illustrated embodiment wherein the number of connectors to external electronics is relatively small, those connections are effected by an interconnect 61 comprised of a plurality of discrete conductive strips 62, 64 and 66, formed on one or more surfaces of the layers 13. The conductive strips may thereby be connected to conductive patterns on the surface of the supporting layer as well as on the surface of upper and lower layers. If desired, additional layers may be provided with such conductive strips.

Various processes may be used to fabricate the module 11. In accordance with one such process, the individual layers 13 are first profiled to the desired shape and opening pattern (if necessary) to provide space for the electronic devices. A metalized pattern is thereafter deposited onto the surface of each layer using techniques such as photo-delineation of the desired pattern. Each layer is provided with a sheet of adhesive shaped to conform with the shape of the layers. Each layer with an adhesive sheet applied may then be heated in an oven for a time and at a layer using techniques such as photo-delineation of the desired pattern. Each layer is provided with a sheet of adhesive shaped to conform with the shape of the layers. Each layer with an adhesive sheet applied may then be heated in an oven for a time and at a temperature to provide adherence without curing of the adhesive. Subsequently, the adhesive sheet may be further trimmed to the profile of the layer to which it has been applied.

The layers are then stacked upon a male fixture, coated with a parting agent, in the order in which the module is to be formed. A similarly coated female fixture is overlapped upon the completed stack, and joins the male fixture to minimize rotation of the layers within the fixtures. A shim is placed between the male and female fixtures to control the finished module thickness to a dimension consistent with vertical stackability. The fixtured assembly is then placed in a laminating press and subjected to a temperature and pressure cycle that fully cures the adhesive bonds between the layers. The module is then cooled, removed from the fixture, and excessive adhesive is then removed. After the epoxy is then cured and the excess cleaned the module is machined by a process such as diamond grinding. The machining process serves to expose the conductive patterns for connections and to conform the dimensions of the module to dimensions consistent with lateral abuttment with similar modules. Conductive pads may be photodelineated on the ends of the module to facilitate connection between the metalized pattern on each layer and a dedicated detector or back plane portion.

Vias to connect conductive patterns on different layers within the module 11 may be formed by various means. One technique of forming the vias is to drill holes through the layers by means of a laser drill and to deposit metal on and through the holes by means of metal sputtering techniques.

In one exemplary embodiment each layer 13 is formed to have a length, l, of approximately 2.9 inches, a width w of approximately 1.024 inches and a thickness t of approximately 0.004 inches. Eight of such layers are then stacked to form a module approximately 0.032 inches thick. In turn, thirty-two modules are stacked to form a subarray, approximately 1.024 inches thick. Twenty-five sub-arrays may, for example, be placed adjacent to each other (five subarrays on a side), and bump bonded together to form a small square array.

As indicated above, various detector modules, optical and/or mechanical arrangements and data processing techniques other than the particular implementation described above may be utilized in conjunction with the present invention. The above description is, therefore, intended to merely be illustrative of a technique for forming the presently preferred embodiment of the invention.

What is claimed is:

1. A high density multi-layered integrated circuit module comprising:
   a plurality of thin film substrate layers disposed in substantially overlapping registry to form a non-conductive supporting body, a plurality of said substrate layers having electronic devices mounted thereon;
   insulating sheets disposed intermediate said layers;
   a plurality of detector element connectors formed along a first edge portion of said body;
   metalized conductive patterns formed along a major surface of a plurality of said layers, said conductive patterns having first portions interconnecting said detector element connectors and said electronic devices, and second portions for communicating signals between said electronic devices and external electronics, said conductive pattern second portions being formed on the surface of said layers and extending to edge portions thereof;
   an electrical interconnect formed along a second edge portion of said body, said interconnect being connectable to external electronics and to said conductive pattern second portions at said layer edge portions; and
   a plurality of electrically conductive connectors disposed transverse to said layers, said conductive connectors electrically connecting said conductive pattern second portions formed on different layers.

2. The apparatus as recited in claim 1 wherein said interconnect comprises a back plane disposed transverse to said layers, abutting said body second edge portion, said back plane having a metalized conductive pattern formed upon a major surface thereof, said back plane conductive pattern being in abutting electrical connection with said conductive pattern second portions formed on a plurality of said layers.

3. The apparatus as recited in claim 2 wherein said conductive connectors comprise a plurality of conductive vias, each of said vias being connected to a plurality of said conductive pattern second portions, a plurality of said vias being connected to said back plane by a portion of said conductive pattern second portions.

4. The apparatus as recited in claim 3 wherein said conductive pattern second portions are connected to a first region of said back plane conductive pattern.

5. The apparatus as recited in claim 4 wherein said electronic devices comprise integrated circuits.

6. The apparatus as recited in claim 5 wherein said conductive vias, and back plane conductive pattern, and said conductive pattern second portions are disposed so as to reduce conductor congestion on the surface of the layers.

7. The apparatus as recited in claim 2 wherein said conductive connectors comprise conductive regions forming a portion of said back plane conductive pattern.

8. The apparatus as recited in claim 1 wherein said conductive connectors comprise vias interconnecting conductive patterns formed on opposite sides of the center of the module.

9. The apparatus as recited in claim 1 wherein said interconnect comprises a plurality of discrete conductive strips formed on the surface of at least one of said layers, said conductive strips being electrically connected to said conductive pattern second portions formed on a plurality of said layers.

10. The apparatus as recited in claim 1 further comprising an array of infrared frequency detector elements disposed transverse to said layers, each of said detector elements being connected to a dedicated detector element connector.

11. A process for forming a high density multi-layered integrated circuit package comprising:
    forming a plurality of non-conductive thin film substrate layers;
    stacking said substrate layers in substantially overlapping registry to form a supporting body;
    forming a plurality of detector element connectors along a first end of said body;
    mounting electronic devices on a plurality of said substrate layers;
    forming metalized conductive patterns on the surface of said layers, said patterns having first portions interconnecting said detector element connectors and said electronic devices, and second portions for facilitating connections between and among said electronic devices and external electronics, said conductive pattern second portions being formed on the surface of at least several of said layers and extending to edge portions thereof;
    forming an electrical interconnect along a second end of said body, said interconnect being connectable to external electronics and to said conductive pattern second portions at said layer edge portions; and
    forming a plurality of conductive connectors transverse to said layers and in electrical communication with said conductive pattern second portions formed on a plurality of said layers.

12. The process as recited in claim 11 herein the step of forming a plurality of conductive connectors comprises forming a plurality of conductive vias within said body and connecting said vias to conductive pattern second portions formed on a plurality of said layers.

13. The process as recited in claim 11 wherein the step of forming an electrical interconnect comprises the step of connecting a back plane to a second end of said body, said back plane being disposed transverse to said layers and in electrical communication with external electronics, said back plane having a back plane conductive pattern formed thereon, said back plane conductive pattern being electrically connectable to said conductive pattern second portions formed on a plurality of said layers.

14. The process as recited in claim 11 wherein the step of forming an electrical interconnect comprises the steps of forming a plurality of discrete conductive strips on the surface of at least one of said layers and connecting said conductive strips to conductive pattern second portions formed on a plurality of said layers.

15. A process for connecting a plurality of electronic devices to a detector array and external electronics, said process comprising:

forming a plurality of non-conductive substrate layers;

forming conductive patterns on the surface of said layers;

mounting electronic devices on a plurality of said layers;

forming a plurality of insulating adhesive sheets;

stacking said layers and said sheets in alternating order and in substantially overlapping registry to form a multilayer module;

connecting an array of detectors to said multilayer module, said array extending transverse to said layers and abutting first edge portions of said layers;

connecting a back plane to said module, said back plane being connectable to external electronics and extending transverse to said layers abutting second edge portions of said layers, said back plane having a back plane conductive pattern formed thereon, said back plane conductive pattern being comprised of a plurality of discrete back plane conductive regions in selective electrical communication with said layer conductive patterns on a plurality of said layers;

connecting first and second electronic devices to first and second conductive pattern portions respectively, each of said first and second conductive pattern portions being formed on a different layer;

connecting said first and second conductive pattern portions to a first conductive via, said first being formed within said module and extending transverse to said layers;

connecting third and fourth electronic devices to third and fourth conductive pattern portions respectively, each of said third and fourth conductive pattern portions being formed on a different layer;

connecting said third and fourth conductive pattern portions to a second conductive via, said second via being formed within said module and extending transverse to said layers;

connecting one of said third and fourth conductive pattern portions to a first back plane conductive region;

connecting fifth and sixth electronic devices to fifth and sixth conductive pattern portions respectively, each of said fifth and sixth conductive pattern portions being formed on a different layer; and connecting each of said fifth and sixth conductive pattern portions to a second back plane conductive region.

16. The process as recited in claim 15, further comprising the step of connecting seventh and eighth electrical devices to seventh and eighth conductive pattern portions respectively, said seventh and eighth conductive pattern portions being formed on the surface of the same layer; and connecting seventh and eighth conductive pattern portions to a third back plane conductive region.

17. The process as recited in claim 16, further comprising the step of forming said conductive vias, back plane conductive regions and conductive patterns so as to reduce conductor congestion on the surface of the layers.

* * * * *